United States Patent
Sonoda et al.

(10) Patent No.: US 10,572,093 B2
(45) Date of Patent: Feb. 25, 2020

(54) OLED PANEL

(71) Applicant: Sharp Kabushiki Kaisha, Sakai, Osaka (JP)

(72) Inventors: Tohru Sonoda, Sakai (JP); Takashi Ochi, Sakai (JP); Hisao Ochi, Sakai (JP); Tohru Senoo, Sakai (JP); Takeshi Hirase, Sakai (JP); Akihiro Matsui, Sakai (JP); Jumpei Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 67 days.

(21) Appl. No.: 16/066,075

(22) PCT Filed: Jan. 25, 2017

(86) PCT No.: PCT/JP2017/002593
§ 371 (c)(1),
(2) Date: Jun. 26, 2018

(87) PCT Pub. No.: WO2018/138811
PCT Pub. Date: Aug. 2, 2018

(65) Prior Publication Data
US 2019/0361550 A1 Nov. 28, 2019

(51) Int. Cl.
| G06F 3/047 | (2006.01) |
| H01L 27/32 | (2006.01) |
| H01L 51/00 | (2006.01) |
| H01L 51/52 | (2006.01) |

(52) U.S. Cl.
CPC ............ *G06F 3/047* (2013.01); *H01L 27/323* (2013.01); *H01L 27/3244* (2013.01); *H01L 51/0097* (2013.01); *H01L 51/5246* (2013.01); *H01L 51/5253* (2013.01); *H01L 51/5275* (2013.01); *G06F 2203/04102* (2013.01); *H01L 2251/5338* (2013.01)

(58) Field of Classification Search
CPC .......... G06F 3/047; G06F 2203/04102; H01L 51/5275; H01L 51/5253; H01L 27/323; H01L 51/5246; H01L 51/0097; H01L 2251/5338; H01L 27/3244
See application file for complete search history.

(56) References Cited

U.S. PATENT DOCUMENTS

| 2002/0180371 A1* | 12/2002 | Yamazaki ........... H01L 27/3246 315/169.3 |
| 2005/0258441 A1 | 11/2005 | Shitagami |
| 2007/0262705 A1 | 11/2007 | Fukuda et al. |

(Continued)

FOREIGN PATENT DOCUMENTS

| JP | 2006-4907 A | 1/2006 |
| JP | 2010-56073 A | 3/2010 |

(Continued)

OTHER PUBLICATIONS

Official Communication issued in International Patent Application No. PCT/JP2017/002593, dated Apr. 18, 2017.

*Primary Examiner* — Muhammad N Edun
(74) *Attorney, Agent, or Firm* — Keating & Bennett, LLP

(57) ABSTRACT

OLED elements and a seal portion covering the OLED elements are provided on an upper side of a base substrate. The seal portion includes a light-transmitting conductive film.

20 Claims, 7 Drawing Sheets

(56) References Cited

U.S. PATENT DOCUMENTS

| | | |
|---|---|---|
| 2010/0052521 A1 | 3/2010 | Kim et al. |
| 2014/0197417 A1* | 7/2014 | Nanai ................ H01L 27/3246 |
| | | 257/72 |
| 2014/0212672 A1 | 7/2014 | Han et al. |
| 2014/0339521 A1 | 11/2014 | Ozawa |
| 2016/0064690 A1 | 3/2016 | Kook et al. |
| 2016/0349904 A1 | 12/2016 | Miyake et al. |
| 2018/0083225 A1 | 3/2018 | Nishikawa et al. |

FOREIGN PATENT DOCUMENTS

| | | |
|---|---|---|
| JP | 2014-229356 A | 12/2014 |
| JP | 2014-534557 A | 12/2014 |
| JP | 2015-137338 A | 7/2015 |
| JP | 2016-54144 A | 4/2016 |
| JP | 2016-224429 A | 12/2016 |
| WO | 2005/099311 A1 | 10/2005 |
| WO | 2016/147639 A1 | 9/2016 |

* cited by examiner

OLED PANEL

TECHNICAL FIELD

The disclosure relates to an OLED panel including organic light emitting diode (OLED) elements.

BACKGROUND ART

PTL 1 discloses a structure in which OLED elements are surrounded by inorganic films and an organic film and sealed, thereby preventing penetration of moisture and oxygen into the OLED elements.

CITATION LIST

Patent Literature

PTL 1: JP 2016-54144 A (published on Apr. 14, 2016)

SUMMARY

Technical Problem

The structure disclosed in PTL 1 fails to provide a sufficient sealing effect, and thus penetration of foreign matter such as moisture and oxygen may occur, which may adversely affect the OLED elements.

Solution to Problem

According to an embodiment of the disclosure, an OLED panel includes, on an upper side of a base substrate, an OLED element and a seal portion covering the OLED element. The seal portion includes a light-transmitting conductive film.

Advantageous Effects of Disclosure

By covering the OLED element with the seal portion including the light-transmitting conductive film, the sealing effect can be enhanced as compared with existing structures.

BRIEF DESCRIPTION OF DRAWINGS

FIG. 1A is a cross-sectional view of the device, and FIG. 1B is a plan view thereof.

FIG. 2A is a cross-sectional view of the device, and FIG. 1B is a plan view thereof.

FIG. 3A is a cross-sectional view of the device, and FIG. 3B is a plan view thereof.

DESCRIPTION OF EMBODIMENTS

Embodiments of the disclosure will be described below with reference to FIGS. 1A to 7B. These embodiments are merely illustrative.

First Embodiment

Figure 1A:
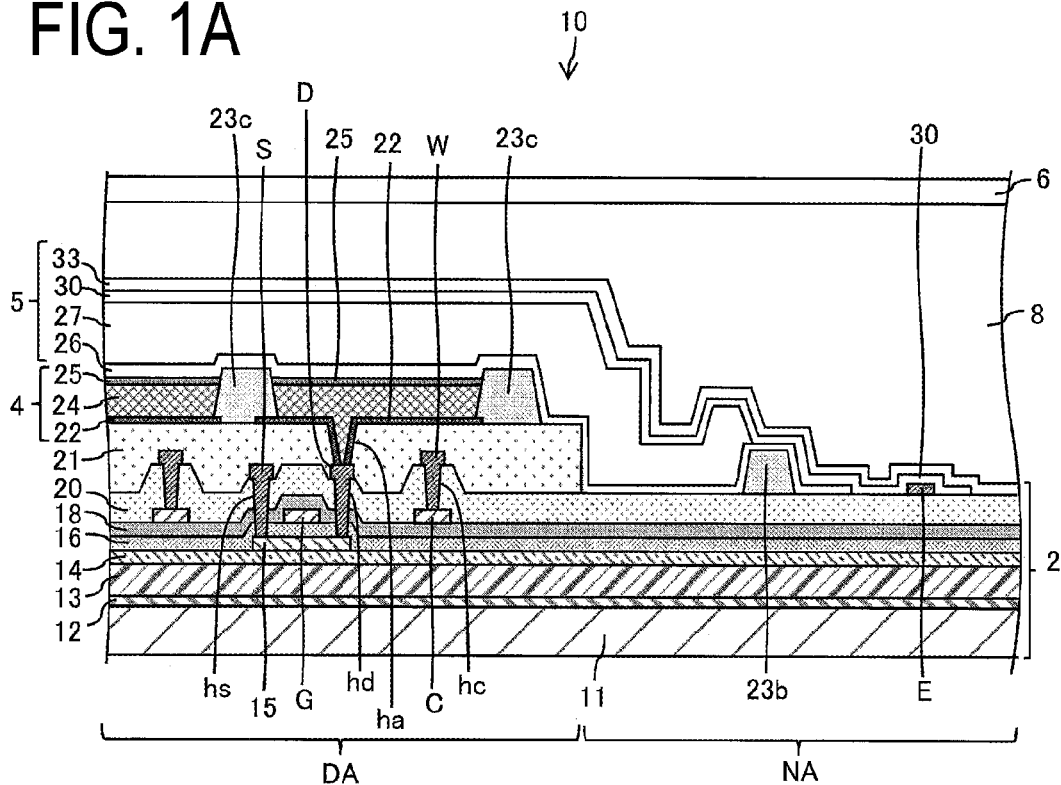
FIGS. 1A and 1B illustrate a configuration of a display device according to a first embodiment.
Figure 1B:
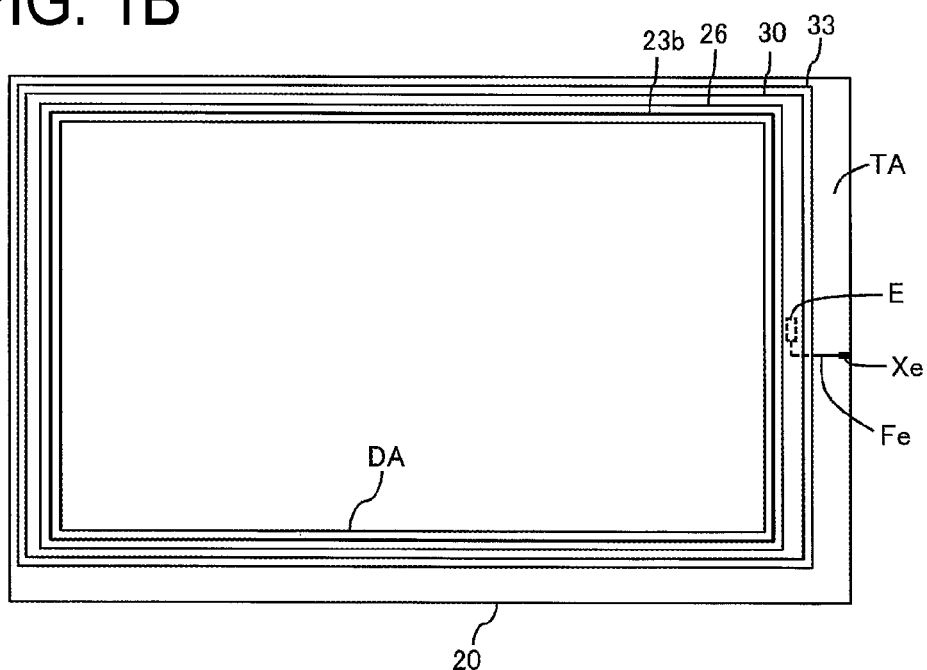

FIGS. 1A and 1B illustrate a configuration of a display device according to a first embodiment. FIG. 1A is a cross-sectional view of the device, and FIG. 1B is a plan view thereof.

As illustrated in FIGS. 1A and 1B, a display device 10 according to a first embodiment includes a flexible organic light emitting diode (OLED) panel 2 and a flexible functional panel 6, which is bonded to the OLED panel 2 via an adhesive layer 8. The functional panel 6 is, for example, a panel that can function as a touch sensor and as a surface protector.

The OLED panel 2 includes a base substrate 11, an adhesive layer 12, a resin layer 13, a moisture-proof layer 14, semiconductor films 15, a gate insulator film 16, gate electrodes G, a first interlayer insulating film 18, capacitive electrodes C, a second interlayer insulating film 20, source electrodes S, drain electrodes D, wires W, a contact electrode E, a flattering film 21, anode electrodes 22, a partition 23c, a bank 23b, organic electroluminescent (EL) layers 24, cathode electrodes 25, a first sealing film 26, a second sealing film 27, a light-transmitting conductive film 30, and a third sealing film 33. The resin layer 13 is bonded to the base substrate 11 via the adhesive layer 12. The moisture-proof layer 14 is formed on the resin layer 13. The semiconductor films 15 are formed on the moisture-proof layer 14. The gate insulator film 16 is formed on the semiconductor films 15. The gate electrodes G are formed on the gate insulator film 16. The first interlayer insulating film 18 covers the gate electrodes G. The capacitive electrodes C are formed on the first interlayer insulating film 18. The second interlayer insulating film 20 covers the capacitive electrodes C. The source electrodes S, the drain electrodes D, the wires W, and the contact electrode E are formed on the second interlayer insulating film 20. The flattering film 21 covers the source electrodes S, the drain electrodes D, and the wires W. The anode electrodes 22 are formed on the flattering film 21. The partition 23c defines subpixels in a display region DA. The bank 23b is formed in a non-display region NA. The organic EL layers 24 are formed on the anode electrodes 22. The cathode electrodes 25 are formed on the organic EL layers 24. The first sealing film 26 covers the partition 23c and the cathode electrodes 25. The second sealing film 27 covers the first sealing film 26. The solid light-transmitting conductive film 30 covers the second sealing film 27. The third sealing film 33 covers the light-transmitting conductive film 30.

The base substrate 11 is formed of an insulating flexible material, for example. The resin layer 13 is formed of polyimide, for example. The moisture-proof layer 14 is formed of silicon oxide (SiOx), silicon nitride (SiNx), or composed of layered films of these materials, for example. The semiconductor film 15 is formed of amorphous silicon or an oxide semiconductor, for example. The gate insulator film 16 is formed of silicon oxide (SiOx), silicon nitride (SiNx), or is composed of layered films of these materials, for example. The gate electrode G, the source electrode S, the drain electrode D, the capacitive electrode C, the wire W, and the contact electrode E each are composed of a single layer metal film or layered metal films, for example. The metal is at least one metal selected from aluminum (Al), tungsten (W), molybdenum (Mo), tantalum (Ta), chromium (Cr), titanium (Ti), and copper (Cu).

The first interlayer insulating film 18 and the second interlayer insulating film 20 may each be formed of, for example, silicon oxide (SiOx) or silicon nitride (SiNx). The flattering film 21 may be formed of a coatable photosensitive organic material, such as a polyimide material or an acrylic material. The anode electrode 22 is formed by, for example, layering an Indium Tin Oxide (ITO) layer and a Ag alloy layer. The anode electrode 22 is light-reflective.

The semiconductor film 15, the gate insulator film 16, the gate electrode G, the first interlayer insulating film 18, the second interlayer insulating film 20, the source electrode S, and the drain electrode D form a thin film transistor (TFT). The semiconductor film 15 and the source electrode S are connected to each other via a contact hole hs extending through the gate insulator film 16, the first interlayer insulating film 18, and the second interlayer insulating film 20. The source electrode S is connected to a power source line (not illustrated), for example. The semiconductor film 15 and the drain electrode D are connected to each other via a contact hole hd extending through the gate insulator film 16, the first interlayer insulating film 18, and the second interlayer insulating film 20. The drain electrode D and the anode electrode 22 are connected to each other via a contact hole ha extending through the flattering film 21. The wire W and the capacitive electrode C are connected to each other via a contact hole he extending through the second interlayer insulating film 20.

The partition 23c and the bank 23b can be formed in the same step, for example, from a coatable photosensitive organic material, such as a polyimide material or an acrylic material. The flattering film 21 and the partition 23c are formed in the display region DA, and not formed in the non-display region NA. The bank 23b and the contact electrode E, which are disposed in the non-display region NA, are formed on the second interlayer insulating film 20.

The organic EL layer 24 is formed in each of the regions surrounded by the partition 23c (subpixel regions) by using a vapor deposition method or an ink-jet method. For example, the organic EL layer 24 is formed by layering a hole injecting layer, a hole transport layer, a light emitting layer, an electron transport layer, and an electron injecting layer in this order, with the hole injecting layer being the bottom layer. The cathode electrode 25 may be formed of a transparent metal compound, such as Indium Tin Oxide (ITO) or Indium Zinc Oxide (IZO), or a translucent metal (e.g., Ag) material. In case of the translucent metal, the cathode electrode 25 has a sufficiently thin thickness to be light-transmissive.

The anode electrode 22, the cathode electrode 25, and the organic EL layer 24, which is sandwiched therebetween, form the organic light emitting diode (OLED) element 4. In the OLED element 4, when a drive current flows between the anode electrode 22 and the cathode electrode 25, holes and electrons recombine in the light emitting layer to form excitons, and when the excitons fall to their ground state, light emission occurs.

The first sealing film 26 and the third sealing film 33 are light-transmitting inorganic insulating films. The second sealing film 27 is a light-transmitting organic insulating film and is thicker than the first sealing film 26 and the third sealing film 33. The first sealing film 26, the second sealing film 27, the light-transmitting conductive film 30, and the third sealing film 33 are layered in this order, with the first sealing film 26 being closest to the OLED elements 4, to form a seal portion 5. The seal portion 5 covers the OLED elements 4 to prevent penetration of foreign matter, such as moisture and oxygen, into the OLED elements 4.

The light-transmitting conductive film 30 may be composed of, for example, a film of a metal compound, such as Indium Tin Oxide (ITO) or Indium Zinc Oxide (IZO), or a highly flexible film, examples of which include a graphene film, a metal nanowire film (e.g., a film including silver nanowires or copper nanowires), and a metal nanoparticle film (e.g., a film including silver nanoparticles or copper nanoparticles).

The first sealing film 26 may be formed of, for example, silicon oxide (SiOx), silicon oxynitride (SiOxNy), or silicon nitride (SiNx), or formed by layering films formed of these materials. The second sealing film 27 may be formed by, for example, applying ink including an organic photosensitive material, such as an acrylic material, by an ink-jet method and curing the ink with UV light. The flow of the ink is stopped by the bank 23b, so that the second sealing film 27 is not formed outside the bank 23b. Advantages of using an ink-jet method to apply the second sealing film 27 include a reduction in material loss, and elimination of the need for a cleaning process using, for example, water or an aqueous solution, which results in a reduced possibility of degradation of the OLED elements 4.

The first sealing film 26, the light-transmitting conductive film 30, and the third sealing film 33, in plan view, are also formed outside the bank 23b. As illustrated in FIG. 1B, in plan view, the edge of the first sealing film 26 is located outside the bank 23b (closer to the edge of the base substrate), the edge of the first sealing film 26 is located inside the edge of the light-transmitting conductive film 30 (closer to the display region), the edge of the third sealing film 33 is located outside the edge of the light-transmitting conductive film 30, and the contact electrode E (on the second interlayer insulating film 20) is located outside the edge of the first sealing film 26 and inside the edge of the light-transmitting conductive film 30.

Thus, the first sealing film 26 is not formed on the contact electrode E. The light-transmitting conductive film 30 and the third sealing film 33 are formed in this order on the contact electrode E. That is, the light-transmitting conductive film 30 and the contact electrode E are disposed outside the bank 23b and inside the edge of the third sealing film 33 and in contact with each other. A terminal area TA is provided outside the edge of the third sealing film 33. The terminal area TA, which is located adjacent to a short side of the base substrate, is free of the seal portion 5.

The contact electrode E is connected to a terminal Xe via a routing wire Fe (formed on the second interlayer insulating film 20), for example. The routing wire Fe is in the same layer as the contact electrode E. The terminal Xe is in the terminal area TA and formed on the second interlayer insulating film 20. With this configuration, ground potential, for example, can be supplied to the light-transmitting conductive film 30 via the terminal Xe, the routing wire Fe, and the contact electrode E.

The display device 10 can be produced in the following manner, for example. First, a backplane is formed. The backplane includes, on a glass substrate, the resin layer 13, the moisture-proof layer 14, the semiconductor films 15, the gate insulator film 16, a first metal layer including the gate electrodes G, the first interlayer insulating film 18, a second metal layer including the capacitive electrodes C, the second interlayer insulating film 20, a third metal layer including the source electrodes S, the drain electrodes D, the wires W, and the contact electrode E, the flattering film 21, and the anode electrodes 22. Next, the organic EL layers 24 and the cathode electrodes 25 are formed on the backplane. Next, the seal portion 5 (including the light-transmitting conductive film 30) is formed to cover the OLED elements 4, each of which includes the anode electrode 22, the organic EL layer 24, and the cathode electrode 25. Next, a protective film is bonded to the seal portion 5, and the glass substrate is removed by, for example, laser irradiation. The flexible base substrate 11 is bonded to the resin layer 13 via the adhesive layer 12. Thus, the flexible OLED panel 2 is obtained. Next, the protective film on the seal portion 5 is removed, and the functional panel 6 is bonded to the seal portion 5 of the OLED panel 2 via the adhesive layer 8.

In the first embodiment, the seal portion 5 includes the light-transmitting conductive film 30, which covers the OLED elements 4 via the first sealing film 26 and the second sealing film 27. Thus, the seal portion 5 is provided with the light-transmitting conductive film 30, which is different in characteristics from the first sealing film 26, which is an inorganic insulating film, and the second sealing film 27, which is an organic insulating film. This configuration can improve the sealing performance. For example, in the case where the third sealing film 33 has pinholes, in a case where the light-transmitting conductive film 30 is absent, moisture and oxygen, after traveling through the pinholes, will penetrate to the second sealing film 27 quickly. On the other hand, when the light-transmitting conductive film 30 is present, as illustrated in FIGS. 1A and 1B, penetration of moisture and oxygen to the second sealing film 27 can be inhibited even in a case where the third sealing film 33 has pinholes. Furthermore, the light-transmitting conductive film 30 is provided to be in contact with the contact electrode E. Thus, the electrical noise generated by the driving of the OLED elements 4 can be shielded. This, for example, can enhance the sensitivity of the touch sensor of the functional panel 6. In a case where the contact electrode E is formed inside the bank 23b, it is necessary to position the edge of the first sealing film 26 inside the bank 23b or to form a contact hole in the first sealing film 26, inside the bank 23b. This may result in a possibility of reduced sealing performance. In this regard, the light-transmitting conductive film 30 and the contact electrode E, as illustrated in FIGS. 1A and 1B, are disposed outside the bank 23b in plan view and in contact with each other. This can prevent the possibility mentioned above.

Furthermore, the thick, second sealing film 27, which is an organic insulating film, is provided between the cathode electrode 25 and the light-transmitting conductive film 30. With this configuration, the possibility of short-circuiting between the cathode electrode 25 and the light-transmitting conductive film 30 can be reduced. Also, the parasitic capacitance between the cathode electrode 25 and the light-transmitting conductive film 30 can be reduced.

In FIGS. 1A and 1B, the routing wire Fe and the terminal Xe are formed in the same layer as the source electrode S and the drain electrode D (on the second interlayer insulating film 20). However, other configurations are also possible. At least one of the routing wire Fe and the terminal Xe may be formed in the same layer as the gate electrode G (on the gate insulator film 16), or may be formed in the same layer as the capacitive electrode C (on the first interlayer insulating film 18).

Figure 2A:
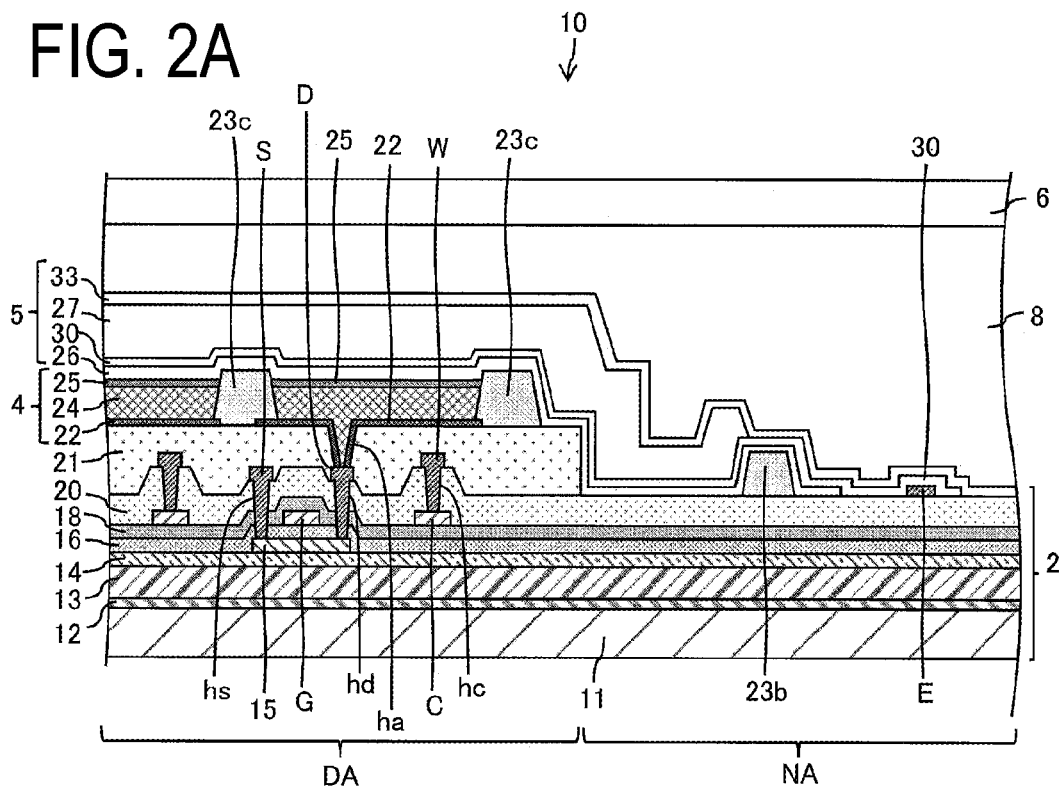
FIGS. 2A and 2B illustrate another configuration of the display device according to the first embodiment.
Figure 2B:
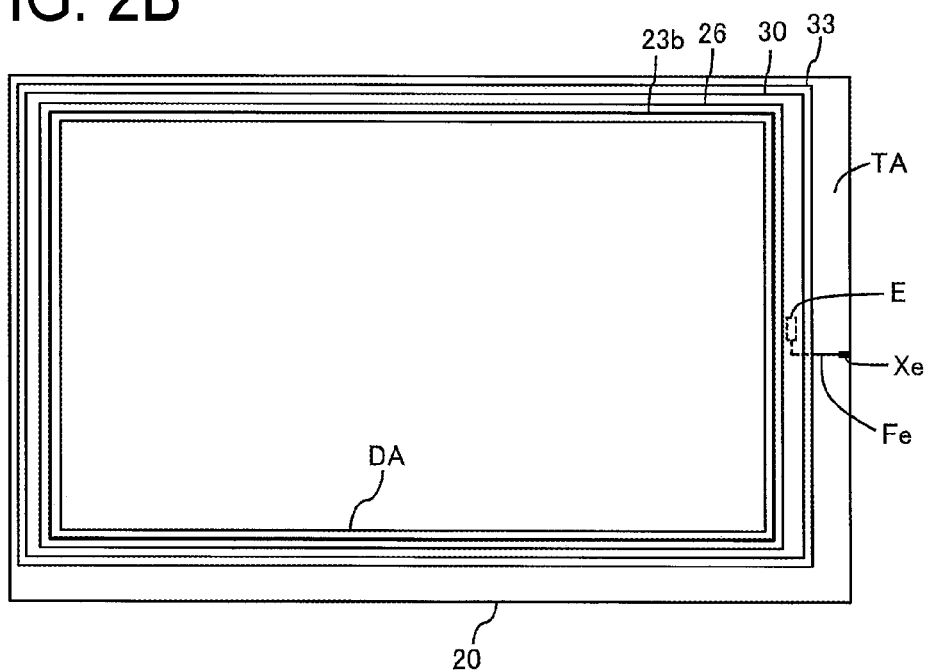

FIGS. 2A and 2B illustrate another configuration of the display device according to the first embodiment. FIG. 2A is a cross-sectional view of the device and FIG. 2B is a plan view thereof. As illustrated in FIG. 2A, the seal portion 5 may be formed by layering the first sealing film 26, the light-transmitting conductive film 30, the second sealing film 27, and the third sealing film 33 in this order, with the first sealing film 26 being closest to the OLED elements 4. The first sealing film 26 is an inorganic insulating film. The second sealing film 27 is an organic insulating film. The third sealing film 33 is an inorganic insulating film.

The first sealing film 26, the light-transmitting conductive film 30, and the third sealing film 33, in plan view, are also formed outside the bank 23b. As illustrated in FIG. 2B, in plan view, the edge of the first sealing film 26 is located outside the bank 23b (closer to the edge of the base substrate), the edge of the first sealing film 26 is located inside the edge of the light-transmitting conductive film 30 (closer to the display region), the edge of the third sealing film 33 is located outside the edge of the light-transmitting conductive film 30, and the contact electrode E (on the second interlayer insulating film 20) is located outside the edge of the first sealing film 26 and inside the edge of the light-transmitting conductive film 30. The light-transmitting conductive film 30 and the contact electrode E are disposed outside the bank 23b and inside the edge of the third sealing film 33 and in contact with each other.

The contact electrode E is connected to the terminal Xe via the routing wire Fe (formed on the second interlayer insulating film 20), for example. The routing wire Fe is in the same layer as the contact electrode E. The terminal Xe is formed on the second interlayer insulating film 20, in the terminal area TA. Ground potential can be supplied to the light-transmitting conductive film 30 via the terminal Xe, the routing wire Fe, and the contact electrode E.

Figure 3A:
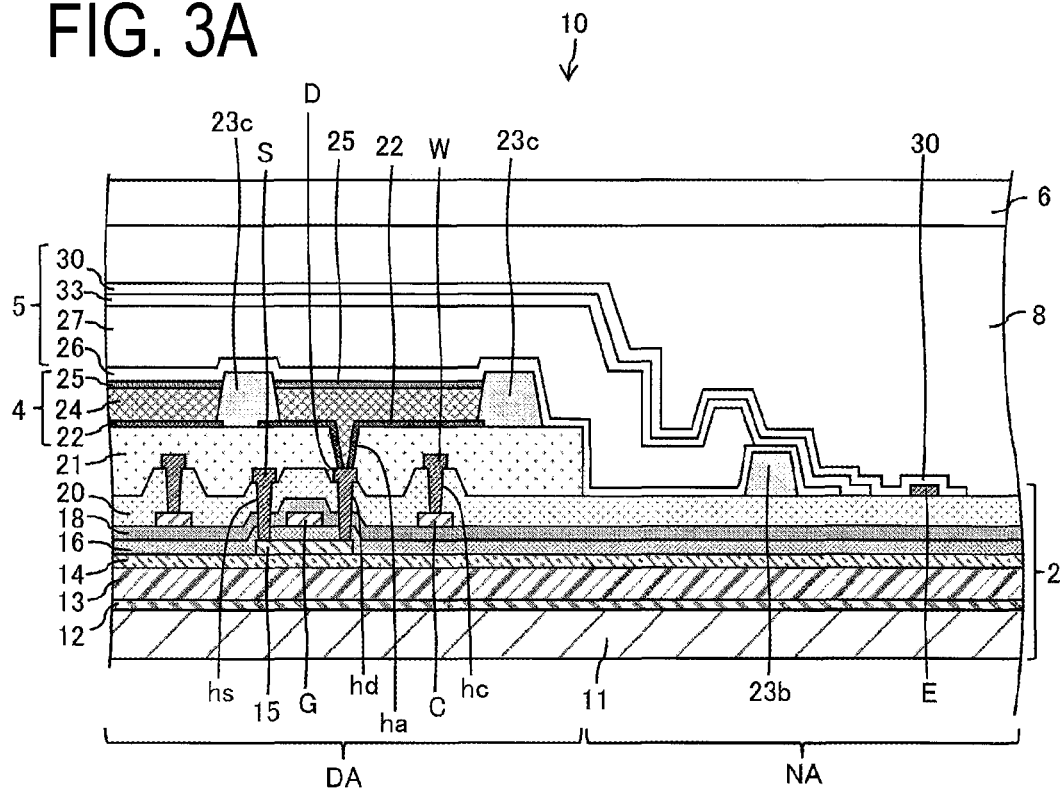
FIGS. 3A and 3B illustrate still another configuration of the display device according to the first embodiment.
Figure 3B:
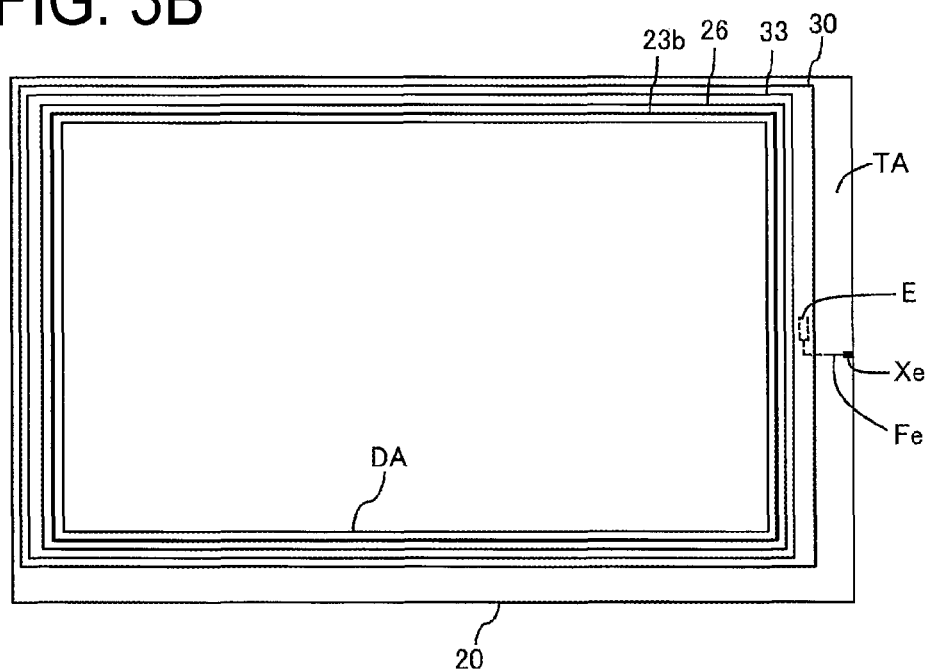

In the configuration of FIG. 2A, the first sealing film 26 may be formed by layering for example, a silicon oxide (SiOx) layer and a silicon nitride (SiNx) layer in order to prevent short-circuiting between the cathode electrode 25 and the light-transmitting conductive film 30. FIGS. 3A and 3B illustrate still another configuration of the display device according to the first embodiment. FIG. 3A is a cross-sectional view of the device, and FIG. 3B is a plan view thereof. As illustrated in FIGS. 3A and 3B, the seal portion 5 may be formed by layering the first sealing film 26, the second sealing film 27, the third sealing film 33, and the light-transmitting conductive film 30 in this order, with the first sealing film 26 being closest to the OLED elements 4. The first sealing film 26 is an inorganic insulating film. The second sealing film 27 is an organic insulating film. The third sealing film 33 is an inorganic insulating film.

The first sealing film 26, the third sealing film 33, and the light-transmitting conductive film 30, in plan view, are also formed outside the bank 23b. As illustrated in FIG. 3B, in plan view, the edge of the first sealing film 26 and the edge of the third sealing film 33 are located outside the bank 23b (closer to the edge of the base substrate), the edge of the first sealing film 26 and the edge of the third sealing film 33 are located inside the edge of the light-transmitting conductive film 30 (closer to the display region), and the contact electrode E (on the second interlayer insulating film 20) is located outside the edge of the first sealing film 26 and the edge of the third sealing film 33 and inside the edge of the light-transmitting conductive film 30.

Thus, the first sealing film 26 is not formed on the contact electrode E. The light-transmitting conductive film 30 is layered in this order on the contact electrode E. That is, the light-transmitting conductive film 30 and the contact electrode E are disposed outside the bank 23b and in contact with each other. The contact electrode E is connected to the terminal Xe via the routing wire Fe (formed on the second interlayer insulating film 20), for example. The routing wire Fe is in the same layer as the contact electrode E. The terminal Xe is formed on the second interlayer insulating film 20, in the terminal area TA. Ground potential can be supplied to the light-transmitting conductive film 30 via the terminal Xe, the routing wire Fe, and the contact electrode E.

The second sealing film 27 (organic insulating film) in FIGS. 1A to 3B may be configured to serve as a phase difference film (optical compensation function). A phase difference film is a film having different refractive indices for the X axis direction and the Y axis direction, which are orthogonal to the Z axis direction (film thickness direction). In the film, the velocity at which a wave propagates in the X axis direction and the velocity at which a wave propagates in the Y axis direction are different. Thus, the phase relationship between two waves at the time at which the two waves enter into the film and the phase relationship between the two waves at the time at which the two waves exit from the film can be varied by the phase difference δ (compensation is provided) (the phase difference δ is proportional to the film thickness and inversely proportional to the wavelength).

The second sealing film 2 described above can be formed by a process including applying a plurality of organic compounds using, for example, an ink-jet method and condensing the compounds, and thereafter, irradiating the condensed product with polarized UV light (ultraviolet light) to impart anisotropy.

For example, a benzylideneaniline compound, which can be obtained by dehydration condensation between an aromatic amine compound and an aromatic aldehyde compound, contains a carbon-nitrogen double bond, which has photoisomerizable properties. By irradiating a benzylideneaniline compound-containing pendant-type polymer film with polarized UV light, a film having anisotropy due to axially selective photoisomerization can be formed (see JP 2016-60857 A).

By configuring the second sealing film 27 to serve as a phase difference film, the thickness of the OLED panel 2 can be reduced and the flexibility can be increased.

In FIGS. 1A to 3B, the seal portion 5 includes the second sealing film 27 (organic insulating film). However, other configurations are also possible. For example, the seal portion 5 may be composed of the first sealing film 26, the light-transmitting conductive film 30, and the third sealing film 33, which are layered in this order, with the first sealing film 26 being closest to the OLED elements 4.

Second Embodiment

Figure 4A:
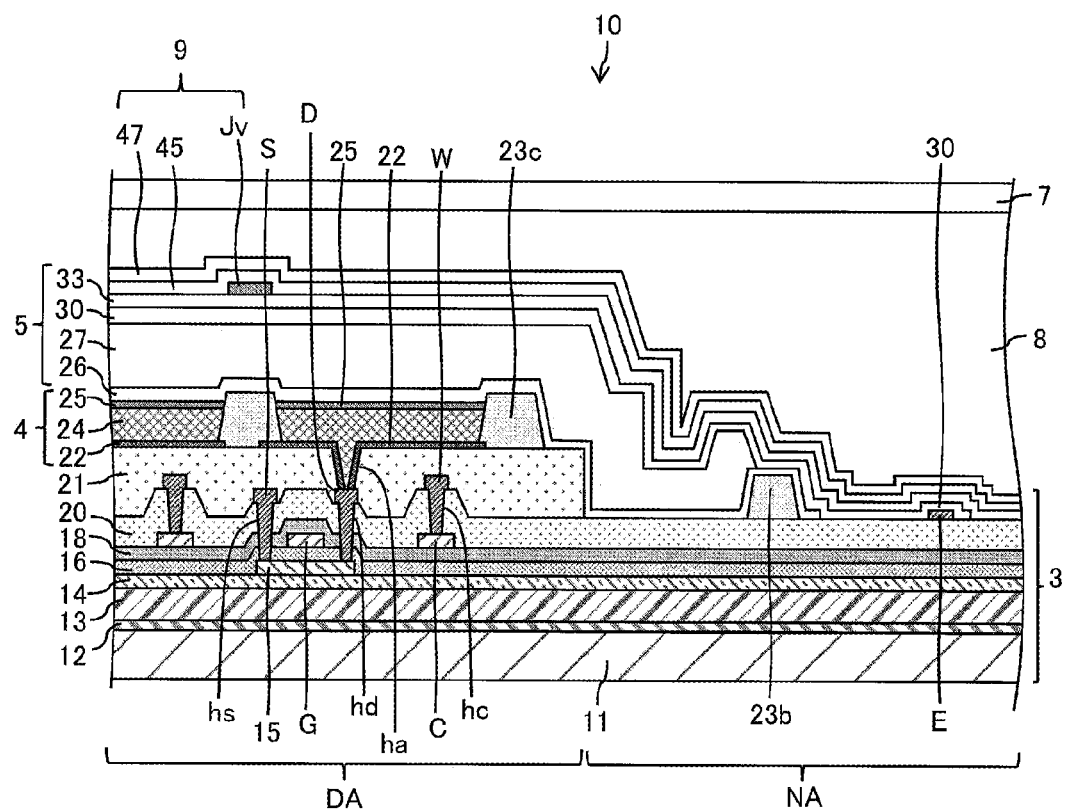
FIG. 4A is a cross-sectional view illustrating a configuration of a display device according to a second embodiment.
Figure 4B:
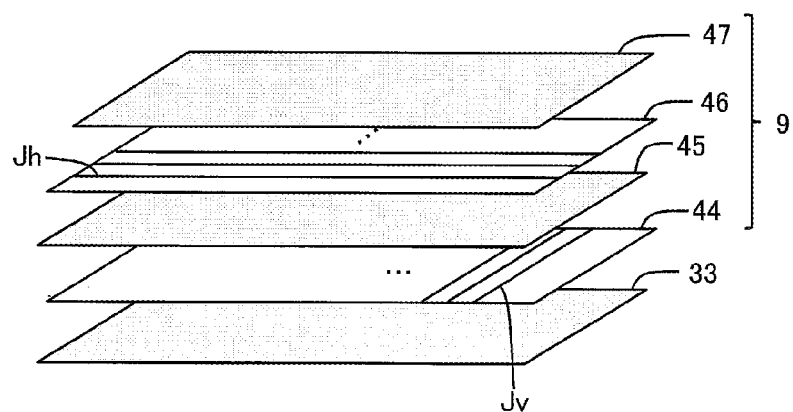
FIG. 4B is a schematic diagram illustrating a configuration of a touch sensor portion.

FIG. 4A is a cross-sectional view illustrating a configuration of a display device according to a second embodiment. FIG. 4B is a schematic diagram illustrating a configuration of a touch sensor portion. In the display device 10 of FIGS. 4A and 4B, an OLED panel 3 (in-cell touch sensor type) and a functional panel 7 are bonded to each other via the adhesive layer 8. The OLED panel 3 includes a touch sensor portion 9 incorporated therein. The configuration of the OLED panel 3 corresponds to that of the OLED panel 2 of FIGS. 1A and 1B except that the touch sensor portion 9 is provided on an upper side of the seal portion 5 with no adhesive layer interposed.

Specifically, a first sensor wiring layer 44, an insulating layer 45, a second sensor wiring layer 46, and an insulating layer 47, which constitute the touch sensor portion 9, are layered in this order on an upper side of the third sealing film 33, which is an inorganic insulating film. With this configuration, the functional panel 7 is not required to have touch sensor functions, and also, the touch portion 9 enhances the sealing effect.

As illustrated in FIG. 4B, the touch sensor portion 9 includes the first sensor wiring layer 44, the second sensor wiring layer 46, the insulating layer 45, and the insulating layer 47. The second sensor wiring layer 46 is disposed over the first sensor wiring layer 44. The insulating layer 45 is sandwiched between the first sensor wiring layer 44 and the second sensor wiring layer 46. The insulating layer 47 is disposed on the second sensor wiring layer 46. A plurality of sensor wires Jv in the first sensor wiring layer 44 are formed by, for example, applying a conductive material-containing liquid by an ink-jet method to the third sealing film 33, which is an inorganic insulating film. Examples of the conductive material include metal nanoparticles (e.g., silver nanoparticles), metal nanowires (e.g., silver nanowires), and graphene. Likewise, a plurality of sensor wires Jh in the second sensor wiring layer 46 are formed by, for example, applying a conductive material-containing liquid by an ink-jet method to the insulating layer 45. Examples of the conductive material include metal nanoparticles (e.g., silver nanoparticles), metal nanowires (e.g., silver nanowires), and graphene.

The sensor wires Jv extend in the column direction (depth direction in the drawing) in the layer, and the sensor wires Jh extend in the row direction (lateral direction in the drawing) in the layer. Advantages of using an ink-jet method to apply the sensor wires Jv and the sensor wires Jh include a reduction in material loss, and elimination of the need for a cleaning process using, for example, water or an aqueous solution, which results in a reduced possibility of degradation of the OLED elements 4.

From an optical point of view, the sensor wires Jv and the sensor wires Jh may be formed to overlap the partition 23c as illustrated in FIG. 4A.

Figure 5A:
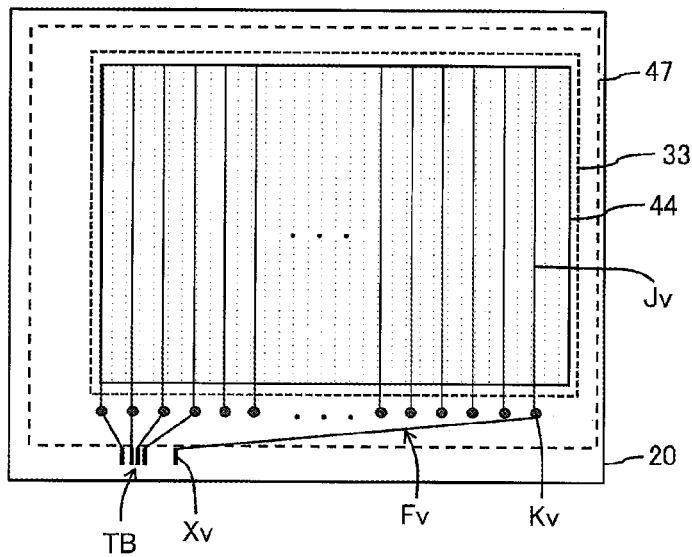
FIGS. 5A and 5C are plan views illustrating the configuration of the display device of FIG. 4.
Figure 5B:
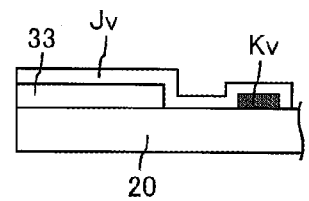
FIGS. 5B and 5D are cross-sectional views illustrating the configuration of the display device of FIG. 4A.
Figure 5C:
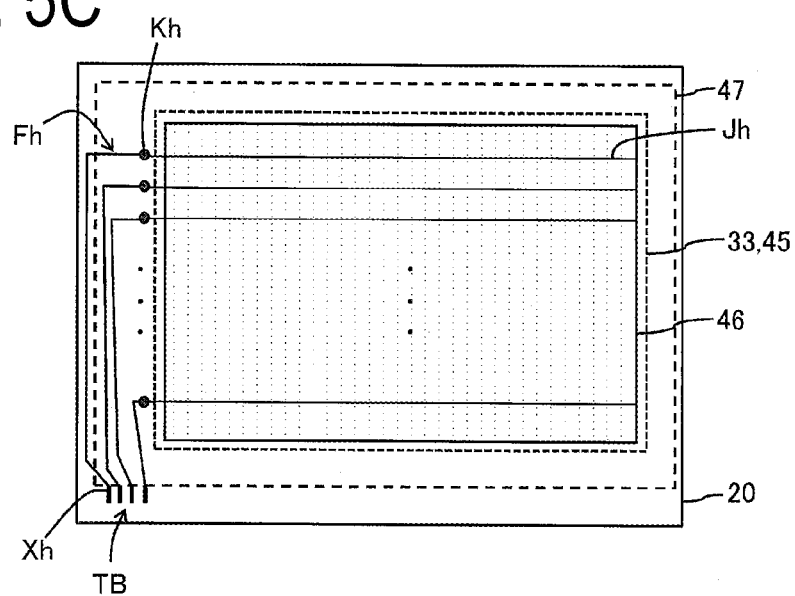

FIGS. 5A and 5C are plan views illustrating the configuration of the OLED panel 3 of FIGS. 4A and 4B. As illustrated in FIG. 5A, the sensor wires Jv are connected to relay electrodes Kv. All the sensor wires Jv are covered with the insulating layer 47. In plan view, the relay electrodes Kv are located outside the edge of the third sealing film 33 (closer to the edge of the base substrate) and inside the edge of the insulating layer 47. The relay electrodes Kv are formed in the same layer as the source electrode S and the drain electrode D (on the second interlayer insulating film 20). As illustrated in FIG. 5B, the sensor wires Jv extend on the upper surface of the third sealing film 33, the end surface of the third sealing film 33, and the upper surface of the second interlayer insulating film 20 to reach and be in contact with the upper surfaces of the relay electrodes Kv.

A terminal area TB is provided adjacent to one of the long sides of the base substrate. The terminal area TB is free of the seal portion 5 and the sensor portion 9. The relay electrodes Kv are connected to terminals Xv via routing wires Fv (formed on the second interlayer insulating film 20), for example. The routing wires Fv are in the same layer as the relay electrodes Kv. The terminals Xv are formed on the second interlayer insulating film 20, in the terminal area TB.

Figure 5D:
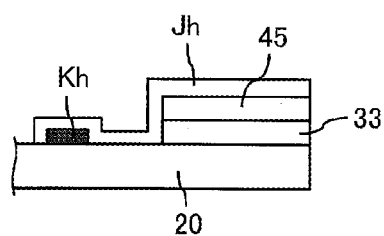

As illustrated in FIG. 5C, the sensor wires Jh are connected to relay electrodes Kh. All the sensor wires Jh are covered with insulating layer 47. In plan view, the relay electrodes Kh are located outside the edges of the third sealing film 33 and the insulating layer 45 (closer to the edge of the base substrate) and inside the edge of the insulating layer 47. The relay electrodes Kh are formed in the same layer as the source electrode S and the drain electrode D (on the second interlayer insulating film 20). As illustrated in FIG. 5D, the sensor wires Jh extend on the upper surface of the insulating layer 45, the end surface of the insulating layer 45 and the end surface of the third sealing film 33, and the upper surface of the second interlayer insulating film 20 to reach and be in contact with the upper surfaces of the relay electrodes Kh. The relay electrodes Kh are connected to terminals Xh via routing wires Fh (formed on the second interlayer insulating film 20), for example. The routing wires Fh are in the same layer as the relay electrodes Kh. The terminals Xh are formed on the second interlayer insulating film 20, in the terminal area TB. The terminals Xh are formed along the same end surface (side surface) as the terminals Xv for the purpose of frame narrowing, but of course, the terminals Xh may be formed along a different end surface.

The touch sensor portion 9 is capable of detecting a change in the capacitance of the sensor wire Jv (depth direction) and the sensor wire Jh (lateral direction) that overlap the finger touching the functional panel 7. Based on the detection results, the touch position is determined.

The display device according to the second embodiment eliminates the need for, for example, bonding a touch panel to the functional panel, and thus can achieve thickness reduction and improved flexibility. The touch sensor portion 9 is located closer to the OLED elements 4 than in the case where a touch panel is included in the functional panel. However, since the light-transmitting conductive film 30 reduces the noise generated by the driving of the OLED elements 4, the sensitivity of the sensor can be ensured.

In FIGS. 5A to 5D, the routing wires Fv and Fh and the terminals Xv and Xh are formed in the same layer as the source electrode S and the drain electrode D (on the second interlayer insulating film 20). However, other configurations are also possible. The routing wires Fv and Fh, and the terminals Xv and Xh may be formed in the same layer as the gate electrode G (on the gate insulator film 16), or may be formed in the same layer as the capacitive electrode C (on the first interlayer insulating film 18).

Figure 6A:
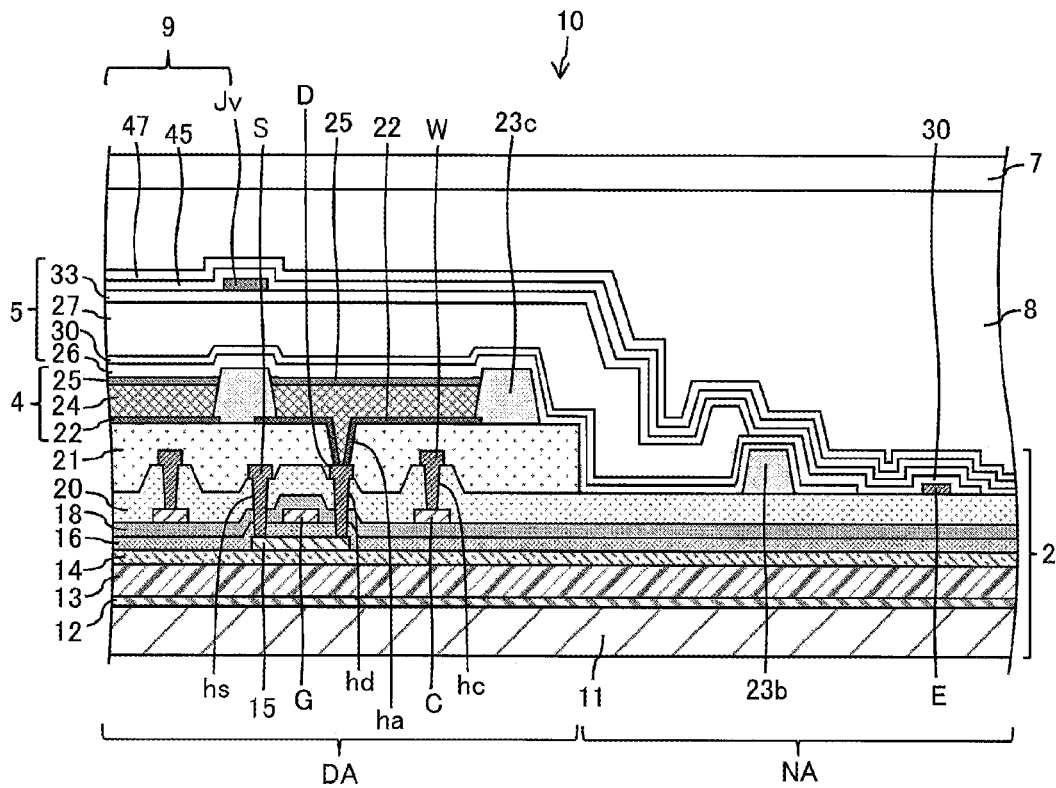
FIG. 6A is a cross-sectional view illustrating another configuration of the display device according to the second embodiment.
Figure 6B:
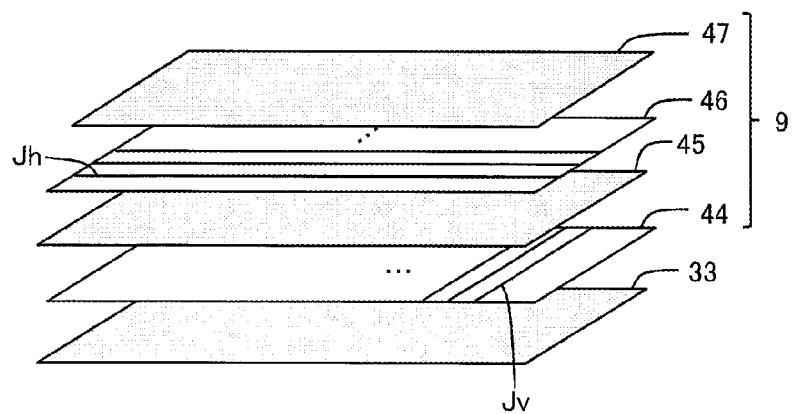
FIG. 6B is a schematic diagram illustrating a configuration of the touch sensor portion.

FIG. 6A is a cross-sectional view illustrating another configuration of the display device according to the second embodiment. FIG. 6B is a schematic diagram illustrating a configuration of the touch sensor portion. In the display device 10 of FIGS. 6A to 6B, the OLED panel 2 (in-cell touch sensor type) and the functional panel 7 are bonded to each other. The OLED panel 3 includes the touch sensor portion 9 incorporated therein. The configuration of the OLED panel 3 corresponds to that of the OLED panel 2 of FIGS. 2A and 2B except that the touch sensor portion 9 is provided on an upper side of the seal portion 5 with no adhesive layer interposed.

Specifically, a first sensor wiring layer 44, an insulating layer 45, a second sensor wiring layer 46 and an insulating layer 47, which constitute the touch sensor portion 9, are layered in this order on an upper side of the third sealing film 33, which is an inorganic insulating film. With this configuration, the functional panel 7 is not required to have touch sensor functions, and also, the touch portion 9 enhances the sealing effect.

In the configuration illustrated in FIGS. 6A and 6B, the second sealing film 27, which is an organic insulating layer, is provided between the light-transmitting conductive film 30 and the first sensor wiring layer 44, and the second sensor wiring layer 46. This configuration can reduce the parasitic capacitance between the sensor wires JV and Jh and the light-transmitting conductive layer 30, and enhance the sensitivity of the sensor.

Figure 7A:
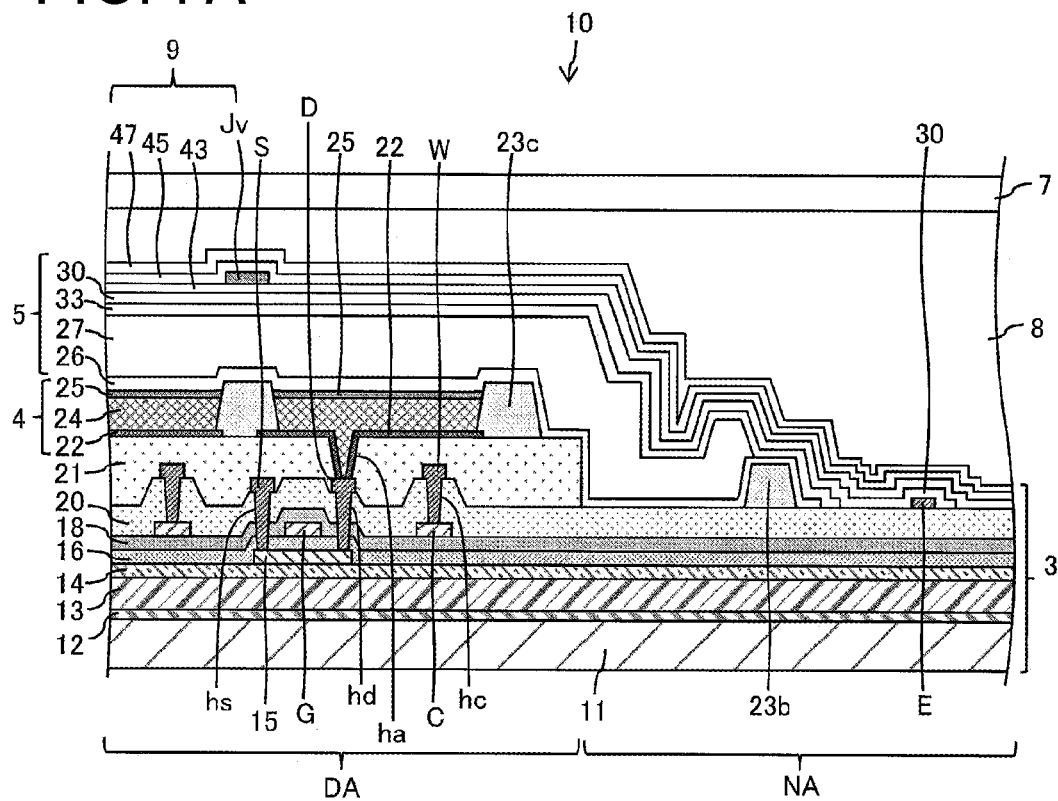
FIG. 7A is a cross-sectional view illustrating still another configuration of the display device according to the second embodiment.
Figure 7B:
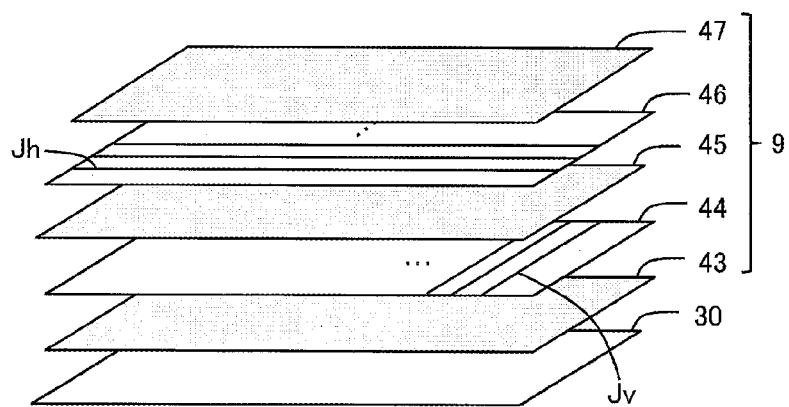
FIG. 7B is a schematic diagram illustrating a configuration of the touch sensor portion.

FIG. 7A is a cross-sectional view illustrating still another configuration of the display device according to the second embodiment. FIG. 7B is a schematic diagram illustrating a configuration of the touch sensor portion. In the display device 10 of FIGS. 7A to 7B, the OLED panel 3 (in-cell touch sensor type) and the functional panel 7 are bonded to each other. The OLED panel 3 includes the touch sensor portion 9 incorporated therein. The configuration of the OLED panel 3 corresponds to that of the OLED panel 2 of FIGS. 3A and 3B except that the touch sensor portion 9 is provided on an upper side of the seal portion 5 with no adhesive layer interposed.

Specifically, an insulating layer 43, the first sensor wiring layer 44, the insulating layer 45, the second sensor wiring layer 46, and the insulating layer 47 are layered in this order on an upper side of the light-transmitting conductive film 30 of the seal portion 5. With this configuration, the functional panel 7 is not required to have touch sensor functions, and also, the touch portion 9 can enhance the sealing effect.

Supplement

In a first aspect, an OLED panel includes, on an upper side of a base substrate, an OLED element and a seal portion covering the OLED element. The seal portion includes a light-transmitting conductive film. The OLED panel is not limited to use in display devices, and is applicable to electronic devices (e.g., detection devices) that use OLEDs as photodiodes or temperature sensors, for example.

In a second aspect, the seal portion includes a first sealing film formed on a lower side of the light-transmitting conductive film. In plan view, an edge of the light-transmitting conductive film is located outside an edge of the first sealing film.

In a third aspect, the seal portion includes a second sealing film formed on an upper side of the first sealing film, the OLED panel includes a bank overlapping an edge of the second sealing film, and in plan view, the edge of the light-transmitting conductive film is located outside the bank.

In a fourth aspect, a contact electrode is provided outside the bank, the contact electrode being in contact with the light-transmitting conductive film.

In a fifth aspect, the contact electrode is provided on a lower side of the light-transmitting conductive film.

In a sixth aspect, the seal portion includes a third sealing film formed on an upper side of the second sealing film.

In a seventh aspect, the first sealing film and the third sealing film are each an inorganic insulating film, and the second sealing film is an organic insulating film.

In an eighth aspect, the first sealing film, the second sealing film, the light-transmitting conductive film, and the third sealing film are formed in this order, with the first sealing film being closest to the OLED elements.

In a ninth aspect, the first sealing film, the light-transmitting conductive film, the second sealing film, and the third sealing film are formed in this order, with the first sealing film being closest to the OLED elements.

In a tenth aspect, the first sealing film, the second sealing film, the third sealing film, and the light-transmitting conductive film are formed in this order, with the first sealing film being closest to the OLED elements.

In an eleventh aspect, in plan view, an edge of the third sealing film is located outside the edge of the light-transmitting conductive film.

In a twelfth aspect, in plan view, an edge of the third sealing film is located inside the edge of the light-transmitting conductive film.

In a thirteenth aspect, the second sealing film includes a photosensitive organic material coatable by an ink-jet method.

In a fourteenth aspect, the light-transmitting conductive film includes at least one of graphene, metal nanowires, and metal nanoparticles.

In a fifteenth aspect, a touch sensor portion is formed on an upper side of the seal portion without an adhesive layer disposed between the seal portion and the touch sensor portion.

In a sixteenth aspect, the touch sensor portion includes a first sensor wiring layer, a second sensor wiring layer over the first sensor wiring layer, and a first insulating layer sandwiched between the first sensor wiring layer and the second sensor wiring layer.

In a seventeenth aspect, sensor wires in the first sensor wiring layer and sensor wires in the second sensor wiring layer include a conductive material coatable by an ink-jet method.

In an eighteenth aspect, the conductive material includes metal nanowires, metal nanoparticles, or graphene.

In a nineteenth aspect, the OLED panel further includes relay electrodes each connected to a corresponding one of sensor wires in the first sensor wiring layer or the second sensor wiring layer, and the sensor wires each extend to an upper surface of a corresponding one of the relay electrodes via end surfaces of insulating layers of the seal portion.

In twentieth aspect, all the sensor wires in the first sensor wiring layer and the second sensor wiring layer are covered with a second insulating layer disposed over the first insulating layer.

In a twenty-first aspect, the OLED panel further includes a partition defining a position of the OLED element, and the sensor wires in the first sensor wiring layer and the second sensor wiring layer overlap the partition.

In a twenty-second aspect, the second sealing film has an optical compensation function.

In a twenty-third aspect, the base substrate is flexible.

The disclosure is not limited to the embodiments stated above, and embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST 2, 3 OLED panel
4 OLED element
5 Seal portion
6, 7 Functional panel
8 Adhesive layer
9 Touch sensor portion
10 Display device
23c Bank
26 First sealing film
27 Second sealing film
30 Light-transmitting conductive film
33 Third sealing film
44 First sensor wiring layer
46 Second sensor wiring layer
E Contact electrode
ha, hc, hd, hs Contact hole

The invention claimed is:
1. An OLED panel comprising: on an upper side of a base substrate,
an OLED element; and
a seal portion covering the OLED element, the seal portion including:
a light-transmitting conductive film;
a first sealing film formed on a lower side of the light-transmitting conductive film; and
a second sealing film formed on an upper side of the first sealing film,
wherein the OLED panel includes a bank overlapping an edge of the second sealing film,
in plan view, an edge of the light-transmitting conductive film is located outside an edge of the first sealing film, and
in plan view, the edge of the light-transmitting conductive film is located outside the bank.
2. The OLED panel according to claim 1,
wherein a contact electrode is provided outside the bank, the contact electrode being in contact with the light-transmitting conductive film.
3. The OLED panel according to claim 2,
wherein the contact electrode is provided on a lower side of the light-transmitting conductive film.
4. The OLED panel according to claim 1,
wherein the seal portion includes a third sealing film formed on an upper side of the second sealing film.
5. The OLED panel according to claim 4,
wherein the first sealing film and the third sealing film each include an inorganic insulating film, and
the second sealing film includes an organic insulating film.
6. The OLED panel according to claim 5,
wherein the first sealing film, the second sealing film, the light-transmitting conductive film, and the third sealing film are formed in this order, with the first sealing film being closest to the OLED elements.
7. The OLED panel according to claim 6,
wherein, in plan view, an edge of the third sealing film is located outside the edge of the light-transmitting conductive film.
8. The OLED panel according to claim 5,
wherein the first sealing film, the light-transmitting conductive film, the second sealing film, and the third sealing film are formed in this order, with the first sealing film being closest to the OLED elements.
9. The OLED panel according to claim 5,
wherein the first sealing film, the second sealing film, the third sealing film, and the light-transmitting conductive film are formed in this order, with the first sealing film being closest to the OLED elements.
10. The OLED panel according to claim 9,
wherein, in plan view, an edge of the third sealing film is located inside the edge of the light-transmitting conductive film.
11. The OLED panel according to claim 1,
wherein the second sealing film includes a photosensitive organic material coatable by an ink-jet method.

12. The OLED panel according to claim 1,
wherein the light-transmitting conductive film includes at least one of graphene, metal nanowires, and metal nanoparticles.

13. The OLED panel according to claim 1,
wherein a touch sensor portion is formed on an upper side of the seal portion without an adhesive layer disposed between the seal portion and the touch sensor portion.

14. The OLED panel according to claim 13,
wherein the touch sensor portion includes a first sensor wiring layer, a second sensor wiring layer over the first sensor wiring layer, and a first insulating layer sandwiched between the first sensor wiring layer and the second sensor wiring layer.

15. The OLED panel according to claim 14,
wherein sensor wires in the first sensor wiring layer and sensor wires in the second sensor wiring layer each include a conductive material coatable by an ink-jet method.

16. The OLED panel according to claim 1,
wherein the second sealing film has an optical compensation function.

17. The OLED panel according to claim 1,
wherein the base substrate is flexible.

18. An OLED panel comprising: on an upper side of a base substrate,
an OLED element;
a seal portion covering the OLED element, the seal portion including a light-transmitting conductive film; and
a touch sensor portion formed on an upper side of the seal portion without an adhesive layer disposed between the seal portion and the touch sensor portion, the touch sensor portion including:
a first sensor wiring layer;
a second sensor wiring layer over the first sensor wiring layer; and
a first insulating layer sandwiched between the first sensor wiring layer and the second sensor wiring layer,
wherein the OLED panel includes
relay electrodes each connected to a corresponding one of sensor wires in the first sensor wiring layer or the second sensor wiring layer, and
the sensor wires each extend to an upper surface of a corresponding one of the relay electrodes via end surfaces of insulating layers of the seal portion.

19. The OLED panel according to claim 18,
wherein all the sensor wires in the first sensor wiring layer and the second sensor wiring layer are covered with a second insulating layer disposed over the first insulating layer.

20. The OLED panel according to claim 18, further comprising
a partition defining a position of the OLED element,
wherein the sensor wires in the first sensor wiring layer and the second sensor wiring layer overlap the partition.

* * * * *